(12) United States Patent
Yamamoto et al.

(10) Patent No.: US 8,289,074 B2
(45) Date of Patent: Oct. 16, 2012

(54) DISCRETE TIME OPERATIONAL TRANSCONDUCTANCE AMPLIFIER FOR SWITCHED CAPACITOR CIRCUITS

(75) Inventors: Kentaro Yamamoto, Ontario (CA); Lennart Mathe, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 211 days.

(21) Appl. No.: 12/729,149

(22) Filed: Mar. 22, 2010

(65) Prior Publication Data

US 2011/0227646 A1   Sep. 22, 2011

(51) Int. Cl.
*H03F 1/02* (2006.01)
(52) U.S. Cl. .............. 330/9; 330/253; 327/103
(58) Field of Classification Search ............ 327/103; 330/253, 9
See application file for complete search history.

(56) References Cited

U.S. PATENT DOCUMENTS

| | | | |
|---|---|---|---|
| 3,851,266 A * | 11/1974 | Conway ............... | 327/307 |
| 5,293,169 A * | 3/1994 | Baumgartner et al. ...... | 341/172 |
| 6,229,830 B1 | 5/2001 | Ota et al. | |
| 6,339,360 B1 | 1/2002 | Santillano | |
| 6,495,995 B2 * | 12/2002 | Groom et al. ............ | 323/283 |
| 6,504,750 B1 | 1/2003 | Baker | |
| 7,078,964 B2 * | 7/2006 | Risbo et al. ............. | 330/10 |
| 7,352,107 B2 * | 4/2008 | Micko .................... | 310/316.01 |
| 7,908,500 B2 * | 3/2011 | Westwick et al. ......... | 713/323 |
| 2003/0174005 A1 * | 9/2003 | Latham et al. ............ | 327/172 |
| 2007/0096800 A1 | 5/2007 | Yamaguchi | |
| 2008/0106330 A1 | 5/2008 | Yoshida et al. | |
| 2009/0284286 A1 | 11/2009 | Elliot | |
| 2010/0237845 A1 * | 9/2010 | Scaldaferri et al. ........ | 323/299 |

FOREIGN PATENT DOCUMENTS

| | | |
|---|---|---|
| GB | 1500996 A | 2/1978 |
| WO | WO2005054902 A1 | 6/2005 |
| WO | WO2008001163 A1 | 1/2008 |

OTHER PUBLICATIONS

International Search Report and Written Opinion—PCT/US2011/029464—ISA/EPO—Oct. 27, 2011.

* cited by examiner

*Primary Examiner* — Patricia Nguyen
(74) *Attorney, Agent, or Firm* — Kevin T. Cheatham

(57) ABSTRACT

A discrete-time operational transconductance amplifier (OTA) with large gain and large output signal swing is described. In an exemplary design, the discrete-time OTA includes a clocked comparator and an output circuit. The clocked comparator receives an input voltage and provides a digital comparator output. The output circuit receives the digital comparator output and provides current pulses. The output circuit detects for changes in the sign of the input voltage based on the digital comparator output and reduces the amplitude of the current pulses when a change in the sign of the input voltage is detected. The output circuit also generates the current pulses to have a polarity that is opposite of the polarity of the input voltage. The discrete-time OTA may be used for switched-capacitor circuits and other applications.

20 Claims, 12 Drawing Sheets

US 8,289,074 B2

DISCRETE TIME OPERATIONAL TRANSCONDUCTANCE AMPLIFIER FOR SWITCHED CAPACITOR CIRCUITS

BACKGROUND

I. Field

The present disclosure relates generally to electronics, and more specifically to an operational transconductance amplifier (OTA).

II. Background

An OTA is a circuit that receives an input voltage and provides an output current. An OTA may be used for switched-capacitor circuits as well as other circuits. A switched-capacitor circuit is a circuit that performs discrete-time signal processing by transferring charges into and out of capacitors when switches are opened and closed. An OTA is typically used as an amplifier to provide charging and discharging current in a switched-capacitor circuit. A transfer function for a switched-capacitor circuit may be defined based on ratios of capacitor sizes, which may be more accurately achieved than absolute capacitor sizes in an integrated circuit (IC).

An OTA may be implemented in complementary metal oxide semiconductor (CMOS) in order to obtain small size and low power consumption. However, the OTA may have small gain and small output signal swing if implemented with a low-voltage small-geometry CMOS process. The small gain may result in inaccurate charge transfer, and the small output signal swing may limit the dynamic range of a switched-capacitor circuit. There is therefore a need in the art for an OTA with large gain and large output signal swing.

SUMMARY

A discrete-time OTA with large gain and large output signal swing is described herein. A discrete-time OTA is a circuit that receives an input voltage and provides output current pulses. A discrete-time OTA may emulate and replace a conventional OTA (which receives an input voltage and provides an output current) in a switched-capacitor circuit. A discrete-time OTA may provide certain advantages over a conventional OTA, as described below.

In an exemplary design, the discrete-time OTA may include a clocked comparator and an output circuit. The clocked comparator may receive an input voltage and provide a digital comparator output. The output circuit may receive the digital comparator output and provide current pulses. The output circuit may detect for changes in the sign of the input voltage based on the digital comparator output and may reduce the amplitude of the current pulses when a change in the sign of the input voltage is detected. The output circuit may also generate the current pulses to have a polarity that is opposite of the polarity of the input voltage. The clocked comparator and the output circuit may be implemented as described below. The discrete-time OTA may be used for switched-capacitor circuits and other applications.

Various aspects and features of the disclosure are described in further detail below.

DETAILED DESCRIPTION

The word "exemplary" is used herein to mean "serving as an example, instance, or illustration." Any design described herein as "exemplary" is not necessarily to be construed as preferred or advantageous over other designs.

Figure 1:
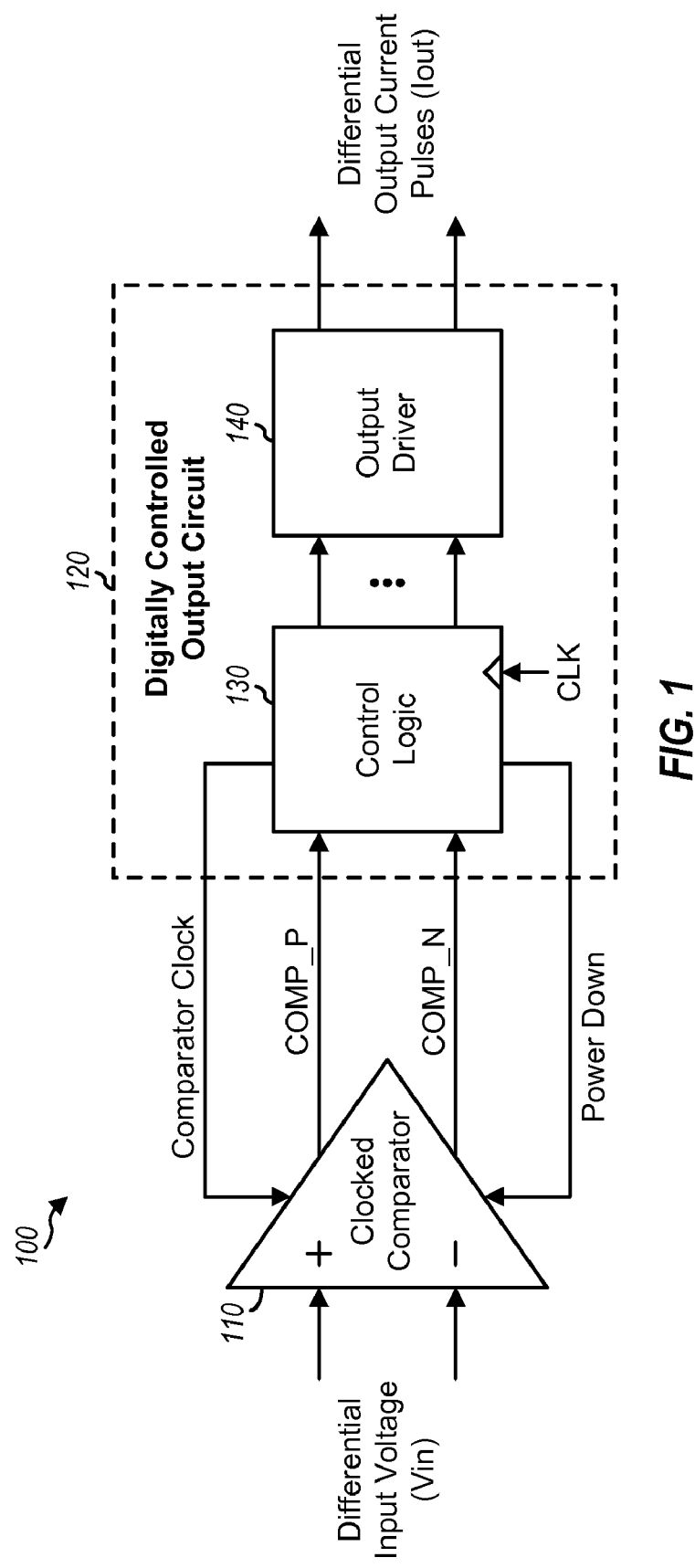
FIG. 1 shows an exemplary design of a discrete-time OTA.

FIG. 1 shows a block diagram of an exemplary design of a discrete-time OTA 100, which may be used for switched-capacitor circuits as well as other circuits. In the exemplary design shown in FIG. 1, discrete-time OTA 100 includes a clocked comparator 110 and a digitally controlled output circuit 120. Comparator 110 receives a differential input voltage, Vin, and detects the sign of the Vin voltage when enabled by a comparator clock from output circuit 120. Comparator 110 provides a complementary digital comparator output comprising COMP_P and COMP_N signals. Comparator 110 may also be power down based on a power down signal from output circuit 120.

In the exemplary design shown in FIG. 1, output circuit 120 includes a control logic 130 coupled to an output driver 140. Control logic 130 controls the operation of comparator 110 and output driver 140 to obtain the desired performance for discrete-time OTA 100. Control logic 130 receives the COMP_P and COMP_N signals from comparator 110 and a clock (CLK) signal and generates the comparator clock and the power down signal for comparator 110, as described below. Control logic 130 also generates a set of drive control signals for output driver 140. Output driver 140 receives the drive control signals and provides a differential output current, Iout, comprising current pulses. The design and operation of comparator 110, control logic 130, and output driver 140 are described in further detail below.

Figure 2A:
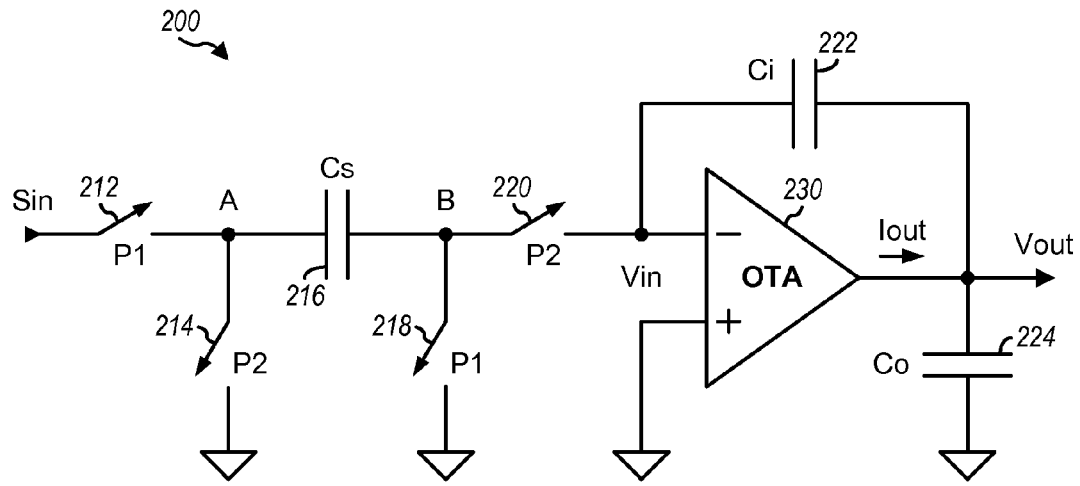
FIG. 2A shows an exemplary design of a switched-capacitor circuit.

FIG. 2A shows a block diagram of an exemplary design of a switched-capacitor circuit 200 comprising an OTA 230. Within switched-capacitor circuit 200, a switch 212 has one end receiving an input signal, Sin, and the other end coupled to node A. A switch 214 has one end coupled to node A and the other end coupled to circuit ground. A capacitor 216 is coupled between node A and node B. A switch 218 has one end coupled to node B and the other end coupled to circuit ground. A switch 220 has one end coupled to node B and the other end coupled to an inverting input of OTA 230. A non-inverting input of OTA 230 is coupled to circuit ground. A capacitor 222 is coupled between the inverting input and an output of OTA 230. A capacitor 224 is coupled between circuit ground and the output of OTA 230, which provides an output signal, Vout. OTA 230 may be implemented with discrete-time OTA 100 in FIG. 1. Switches 212 and 218 are controlled by a P1 control signal, and switches 214 and 220 are controlled by a P2 control signal.

For simplicity, FIG. 2A shows a single-ended design of switched-capacitor circuit 200. For a differential design, the switches and capacitors in FIG. 2A may be replicated and used for a complementary signal path, which may receive a complementary input signal and provide a complementary output signal.

Figure 2B:
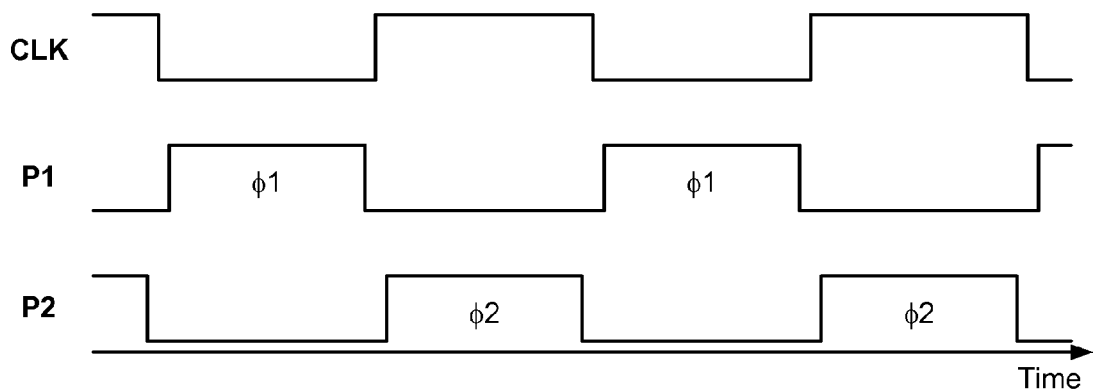
FIG. 2B shows a timing diagram of control signals for the switched-capacitor circuit.

FIG. 2B shows a timing diagram of the P1 and P2 control signals for the switches in switched-capacitor circuit 200 in FIG. 2A. The P1 and P2 signals may be generated based on the CLK signal, which is shown at the top of FIG. 2B. Switches 212 and 218 are enabled during a first phase φ1 when the P1 signal is at logic high and are disabled the remaining time. Switches 214 and 220 are enabled during a second phase φ2 when the P2 signal is at logic high and are disabled the remaining time. The first and second phases are non-overlapping, as shown in FIG. 2B.

Switched-capacitor circuit 200 operates as follows. During the first phase, switches 212 and 218 are closed, switches 214 and 220 are opened, and capacitor 216 is charged by the Sin signal. If the Sin signal is positive, then capacitor 216 is charged by a positive voltage since node B is grounded. During the second phase, switches 212 and 218 are opened, switches 214 and 220 are closed, and the charge on capacitor 216 is passed to capacitor 222. When switches 214 and 220 are closed, the voltage at node B is negative since node A is grounded and the Sin signal was positive in the previous phase. OTA 230 detects an input voltage, Vin, at the inverting input relative to zero Volts (0V) at the non-inverting input and provides an Iout current. In particular, OTA 230 generates positive Iout current to charge capacitors 216 and 222 if the detected Vin voltage is less than 0V and generates negative Iout current to discharge capacitors 216 and 222 if the detected Vin voltage is greater than 0V. The Vin voltage should settle near 0V at steady state, and the Iout current should settle to zero. If the Sin signal is negative, then the complementary actions occur.

Figure 3A:
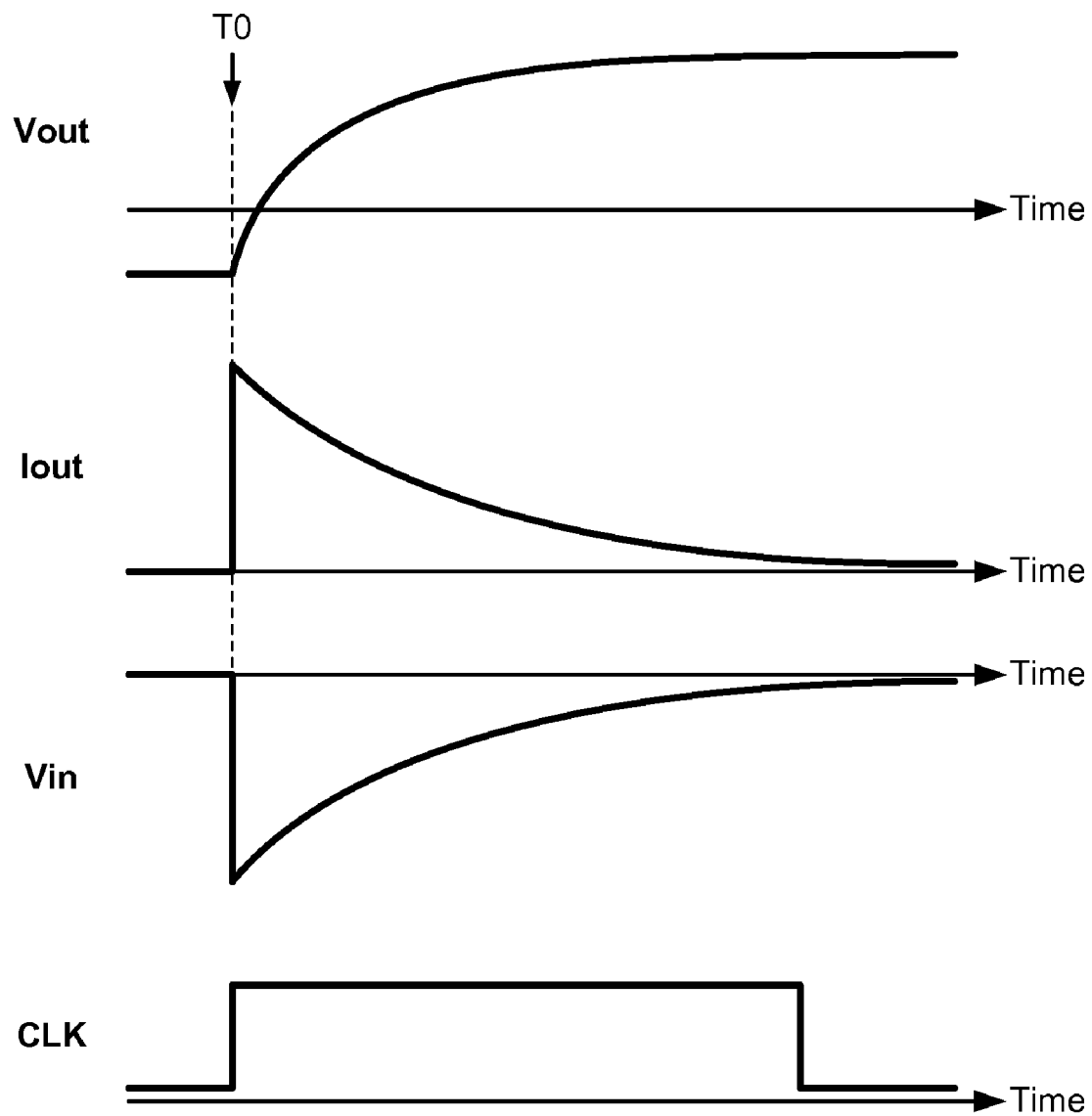
FIGS. 3A and 3B show plots of signals for the switched-capacitor circuit with a conventional OTA and a discrete-time OTA, respectively.

FIG. 3A shows plots of various signals for switched-capacitor circuit 200, with OTA 230 implemented with a conventional OTA that receives an analog input voltage and provides an analog output current. For clarity, FIG. 3A shows various signals for the case in which the Sin signal is positive. Initially, capacitor 216 in FIG. 2A is charged to a positive voltage by the Sin signal. At time T0, switches 214 and 220 are closed, and the Vin voltage abruptly goes negative due to the voltage across capacitor 216. The Iout current from the conventional OTA is related to the Vin voltage and may be given as Iout=$-g_m \cdot$Vin, where $g_m$ is the transconductance of the conventional OTA. The conventional OTA provides a large Iout current at time T0, which charges capacitors 216 and 222 and causes the Vout voltage to increase. The Vin voltage slowly increases and approaches 0V as the negative charge on capacitor 216 is passed to capacitor 222. The Iout current slowly decreases and approaches zero as the Vin voltage approaches 0V. The Vout voltage asymptotically reaches a steady state voltage as Vin and Iout approach zero.

Figure 3B:
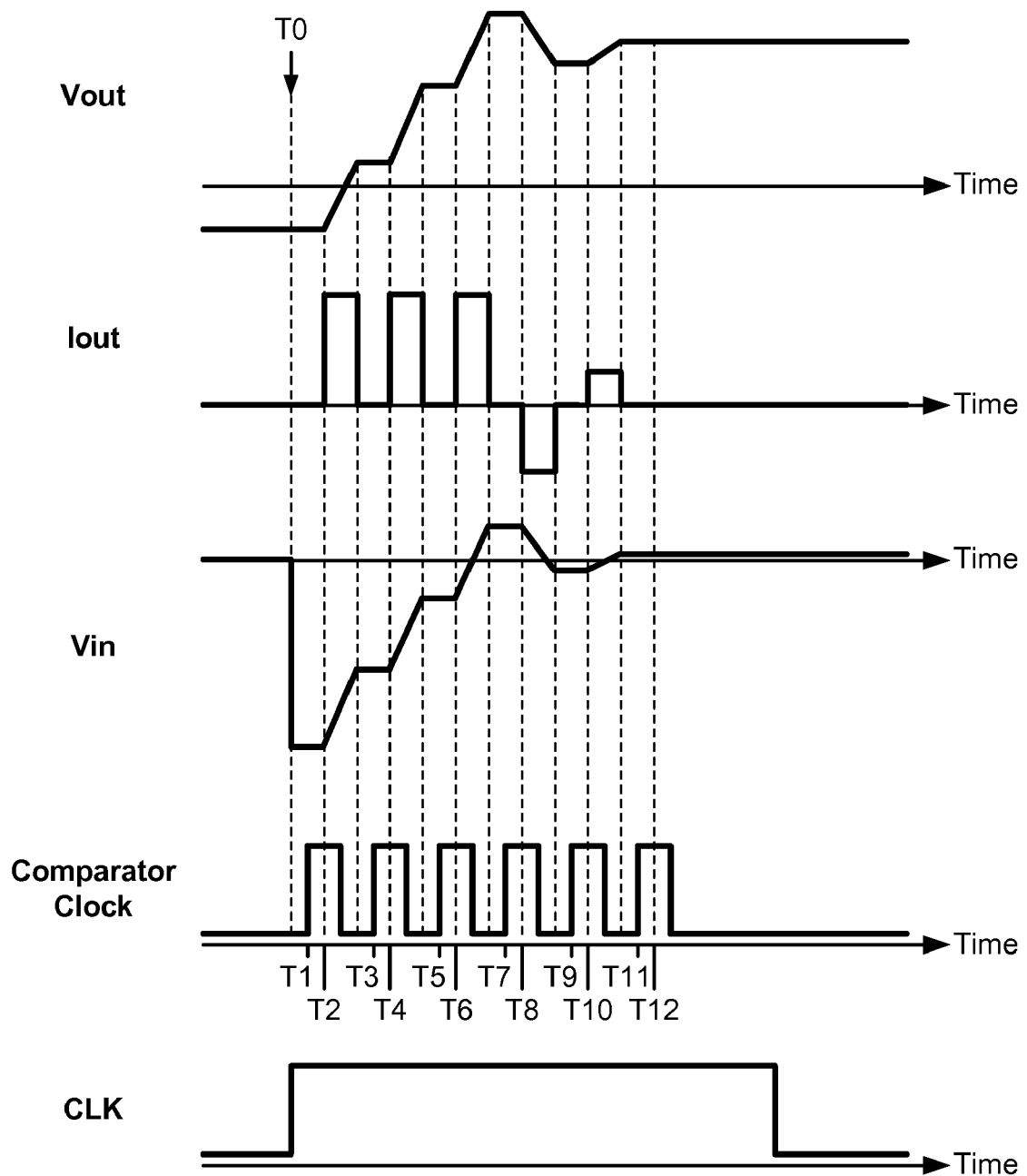

FIG. 3B shows plots of various signals for switched-capacitor circuit 200, with OTA 230 implemented with discrete-time OTA 100 that receives an analog input voltage and provides output current pulses. FIG. 3B also shows the comparator clock for comparator 110. Comparator 110 is disabled when the comparator clock is at logic low and is enabled when the comparator clock is at logic high.

For clarity, FIG. 3B shows various signals for the case in which the Sin signal is positive. Initially, capacitor 216 in FIG. 2A is charged to a positive voltage determined by the Sin signal. At time T0, switches 214 and 220 are closed, and the Vin voltage abruptly goes negative due to the voltage across capacitor 216. The discrete-time OTA detects the sign of the Vin signal at time T1 corresponding to a leading edge of the comparator clock. At time T2, which is a short delay following the sign detection, the discrete-time OTA provides a positive current pulse due to the Vin signal being negative. This current pulse charges capacitors 216 and 222 and causes the Vin and Vout voltages to both increase. The pulse on the Iout current is triggered by the output of comparator 110, which is triggered by leading edges of the comparator clock after some delay. The Iout current returns to zero with its own timing independent of the comparator clock.

The discrete-time OTA again detects the sign of the Vin signal at time T3 corresponding to the next leading edge of the comparator clock. At time T4, the discrete-time OTA provides a positive current pulse due to the Vin signal being negative. This current pulse further charges capacitors 216 and 222 and causes the Vin and Vout voltages to both increase. The Iout current thereafter returns to zero. The discrete-time OTA again detects the sign of the Vin signal at time T5 corresponding to the next leading edge of the comparator clock. At time T6, the discrete-time OTA provides a positive current pulse due to the Vin signal being negative. This current pulse further charges capacitors 216 and 222 and causes the Vin and Vout voltages to both increase. The Iout current thereafter returns to zero.

The discrete-time OTA again detects the sign of the Vin signal at time T7 and provides a negative current pulse at time T8 due to the Vin signal being positive. This current pulse discharges capacitors 216 and 222 and causes the Vin and Vout voltages to both decrease. The Iout current thereafter returns to zero. The discrete-time OTA again detects the sign of the Vin signal at time T9 and provides a positive current pulse at time T10 due to the Vin signal being negative. This current pulse charges capacitors 216 and 222 and causes the Vin and Vout voltages to both increase. The Iout current thereafter returns to zero. The discrete-time OTA again detects the sign of the Vin signal at time T11 and provides a zero current pulse at time T12 due to the Vin signal being less than a predetermined value and/or the amplitude of the current pulses having been reduced to zero. The Vin and Vout voltages are now at steady state.

As shown in FIG. 3B, the discrete-time OTA detects the sign/polarity of the Vin voltage with comparator 110. The discrete-time OTA applies current pulses of a polarity that is opposite of the polarity of the Vin voltage. Furthermore, the amount of current per pulse is reduced for each zero crossing of the Vin voltage, so the Vin voltage converges to zero.

FIG. 3B illustrates various characteristics of the discrete-time OTA. First, the discrete-time OTA operates based on the comparator clock, detects for the sign of the Vin signal during one clock phase, and provides current pulses. Second, the discrete-time OTA can provide current pulses of different amplitude and having polarity determined based on the polarity of the Vin voltage. In one design that is shown in FIG. 3B, the amplitude of the current pulses reduces whenever the Vin voltage changes sign, i.e., whenever zero crossing is detected for the Vin voltage. The amplitude of the current pulses may also be made dependent on the magnitude of the Vin voltage and/or may be adjusted in other manners. This may be achieved by quantizing the Vin voltage to one of a plurality of levels (instead of just two levels for positive or negative voltage) and setting the amplitude of the current pulses based on the quantized Vin voltage level.

FIGS. 3A and 3B show the case in which the Sin signal is positive for the conventional OTA and the discrete-time OTA, respectively. These OTAs operate in a complementary manner for a negative Sin signal.

Figure 4:
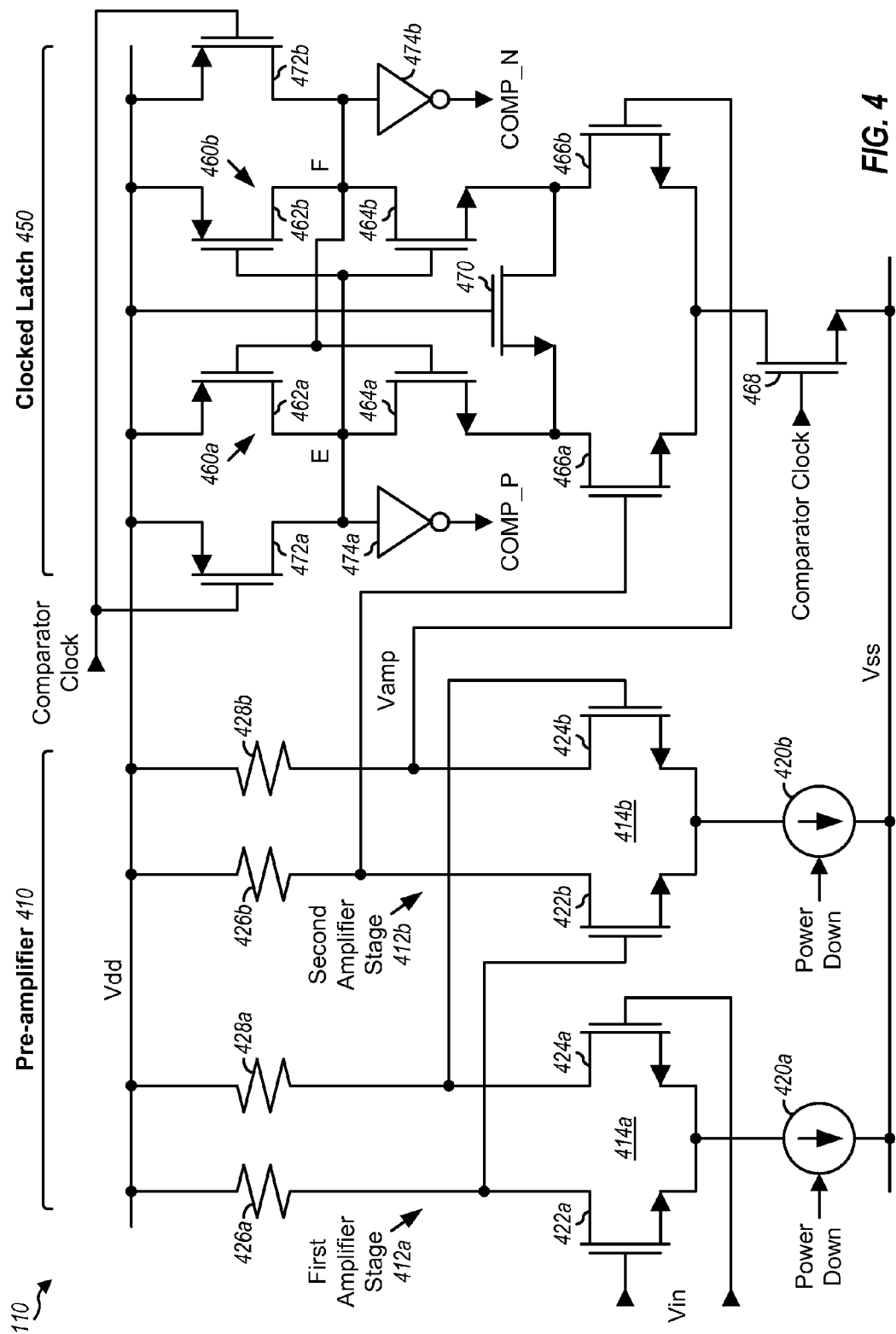
FIG. 4 shows an exemplary design of a clocked comparator.

FIG. 4 shows a schematic diagram of an exemplary design of clocked comparator 110 within discrete-time OTA 100 in FIG. 1. In this exemplary design, clocked comparator 110 includes a pre-amplifier 410 and a clocked latch 450. Pre-amplifier 410 receives and amplifies the Vin voltage and provides an amplified voltage, Vamp. Latch 450 further amplifies the Vamp voltage when enabled by the comparator clock and provides the COMP_P and COMP_N signals.

In the exemplary design shown in FIG. 4, pre-amplifier 410 includes two amplifier stages 412a and 412b coupled in series. Each amplifier stage 412 includes a differential pair 414 formed with N-channel metal oxide semiconductor (NMOS) transistors 422 and 424. Resistors 426 and 428 are coupled between an upper power supply, Vdd, and the drains of NMOS transistors 422 and 424, respectively. Resistors 426 and 428 act as a load for differential pair 414. A current source 420 has one end coupled to the sources of NMOS transistors 422 and 424 and the other end coupled to a lower power supply, Vss. NMOS transistors 422a and 424a in the first amplifier stage 412a have their gates receiving the differential Vin voltage and their drains coupled to the gates of NMOS transistors 422b and 424b in the second amplifier stage 412b. NMOS transistors 422b and 424b provide the differential Vamp voltage at their drains.

In the exemplary design shown in FIG. 4, latch 450 includes two inverters 460a and 460b cross-coupled together. Each inverter 460 is formed with a P-channel metal oxide semiconductor (PMOS) 462 and an NMOS transistor 464. The gates of MOS transistors 462a and 464a are coupled to node F and to the drains of MOS transistors 462b and 464b. The gates of MOS transistors 462b and 464b are coupled to node E and to the drains of MOS transistors 462a and 464a. NMOS transistors 466a and 466b have their gates receiving the differential Vamp voltage from pre-amplifier 410 and their drains coupled to the sources of NMOS transistors 464a and 464b, respectively. An NMOS transistor 468 has its gate receiving the comparator clock, its source coupled to Vss, and its drain coupled to the sources of NMOS transistors 466a and 466b. An NMOS transistor 470 has one source/drain terminal coupled to the drain of NMOS transistor 466a, the other source/drain terminal coupled to the drain of NMOS transistor 466b, and its gate coupled to Vdd. PMOS transistors 472a and 472b have their gates receiving the comparator clock, their sources coupled to Vdd, and their drains coupled to nodes E and F, respectively. Inverters 474a and 474b have their inputs coupled to nodes E and F, respectively, and their outputs providing the COMP_P and COMP_N signals, respectively.

Pre-amplifier 410 operates as follows. The Vin voltage is amplified by the first amplifier stage 412a and is further amplified by the second amplifier stage 412b to obtain the Vamp voltage with the desired gain. Amplifier stages 412a and 412b may be powered down by turning off current sources 420a and 420b.

Latch 450 operates as follows. When the comparator clock is at logic low (or '0'), PMOS transistors 472a and 472b are turned on, nodes E and F are pulled to Vdd, and the COMP_P and COMP_N signals are at logic low. NMOS transistor 468 is also turned off, and inverters 460a and 460b are disabled. Conversely, when the comparator clock is at logic high (or '1'), PMOS transistors 472a and 472b are turned off, NMOS transistor 468 is turned on, and the Vamp signal is sampled by NMOS transistors 466a and 466b. The cross-coupled inverters 460a and 460b further amplify the Vamp signal to rail-to-rail logic level by positive feedback. NMOS transistor 470 may be included to reduce aperture time, which is the time period that an input of a latch can affect an output of the latch.

FIG. 4 shows an exemplary design of clocked comparator 110, which may also be implemented in other manners. For example, pre-amplifier 410 may be implemented with fewer or more amplifier stages, or may be omitted. Latch 450 may be implemented with other designs known in the art.

Figure 5:
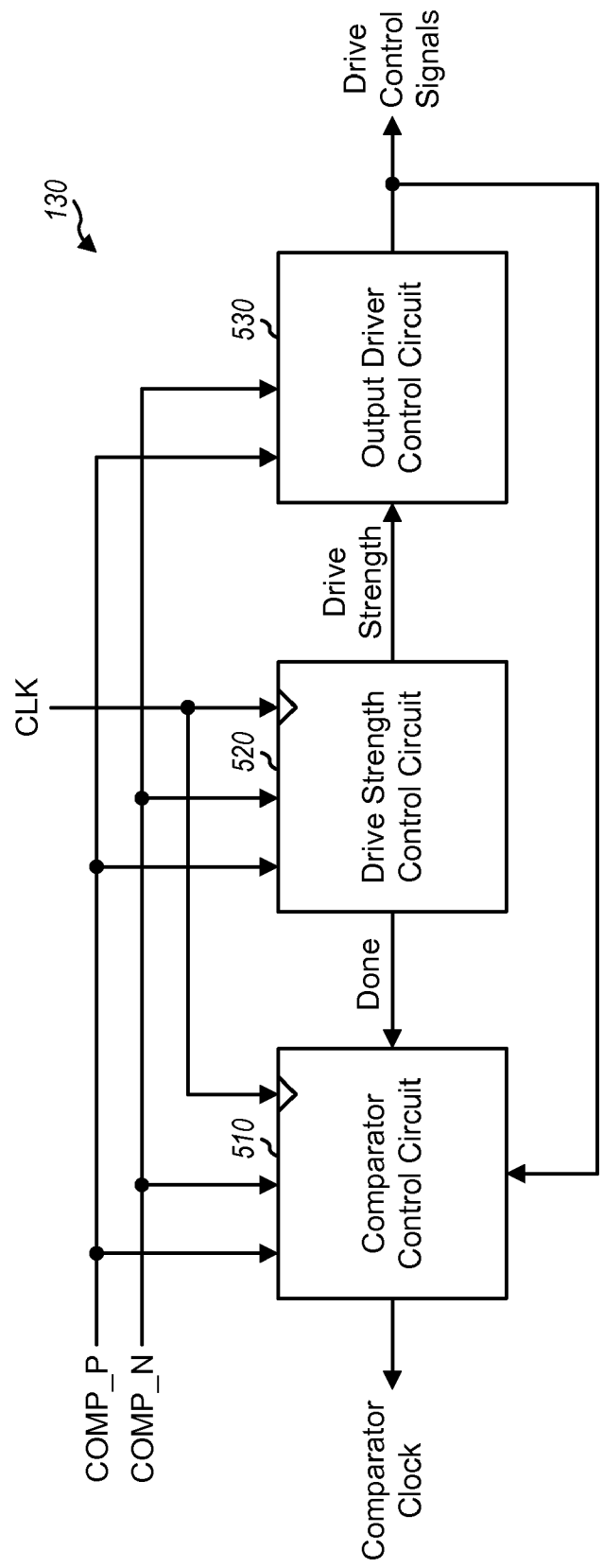
FIG. 5 shows an exemplary design of control logic within the discrete-time OTA.

FIG. 5 shows a block diagram of an exemplary design of control logic 130 within discrete-time OTA 100 in FIG. 1. In this exemplary design, control logic 130 includes a comparator control circuit 510, a drive strength control circuit 520, and an output driver control circuit 530. Comparator control circuit 510 receives the CLK signal, the COMP_P and COMP_N signals from comparator 110, a done signal from drive strength control circuit 520, and the drive control signals from output driver control circuit 530. Comparator control circuit 510 generates the comparator clock for comparator 110.

Drive strength control circuit 520 receives the CLK signal and the COMP_P and COMP_N signals and generates the done signal for comparator control circuit 510 and drive strength signals for output driver control circuit 530. The done signal indicates that the Vout voltage has reached steady state. The done signal transitions to logic high when the last zero crossing of Vin voltage is detected so that comparator control circuit 510 does not enable comparator 110 anymore. The drive strength signals indicate the desired amplitude of the current pulses. Output driver control circuit 530 receives the COMP_P and COMP_N signals and the drive strength signals and generates the drive control signals for output driver 140. The drive control signals turn on one or more output stages within output driver 140 to obtain current pulses of the desired amplitude.

Figure 6:
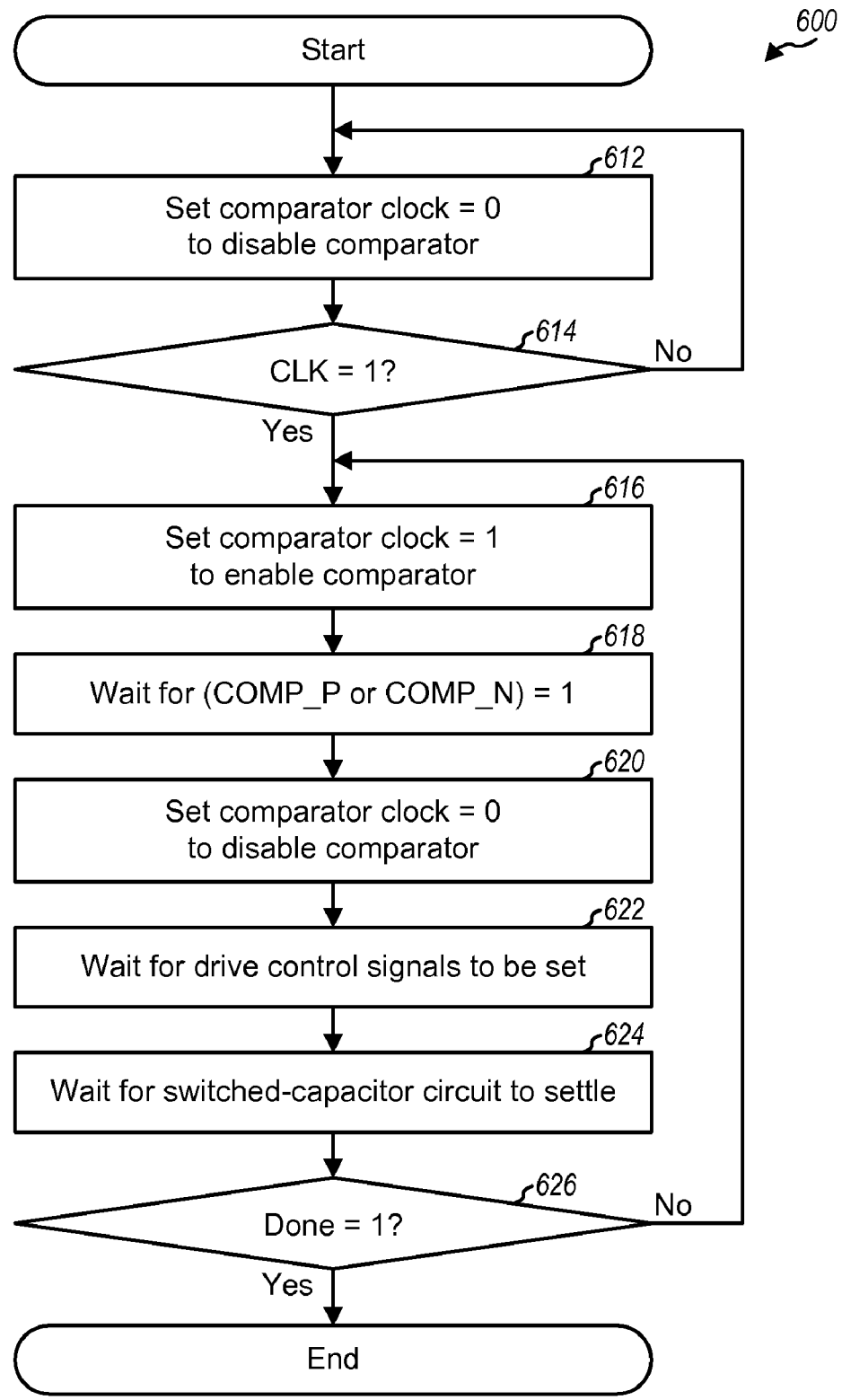
FIG. 6 shows a process illustrating the operation of a comparator control circuit.

FIG. 6 shows an exemplary design of a process 600 illustrating the operation of comparator control circuit 510 in FIG. 5 for one cycle of the CLK signal. Initially, the comparator clock is set to logic low to disable comparator 110 (block 612). A determination is made whether the CLK signal is at logic high (block 614). If the CLK signal is at logic low, then the process returns to block 612. Otherwise, if the CLK signal is at logic high, then the comparator clock is set to logic high to enable comparator 110 (block 616).

Comparator control circuit 510 then waits for the COMP_P or COMP_N signal to transition to logic high, which indicates the detection of a positive Vin voltage or a negative Vin voltage by comparator 110 (block 618). When logic high is detected on either the COMP_P or COMP_N signal, the comparator clock is set to logic low to disable comparator 110 (block 620). Comparator control circuit 510 then waits for the drive control signals to be set (block 622) and for the switched-capacitor circuit to settle (block 624). In one design, comparator control circuit 510 may wait a predetermined amount of time for blocks 622 and 624. This predetermined amount of time may be provided by a delay circuit, which may be implemented with a set of inverters coupled in series. The output of pulse generators in output driver control circuit 530 may be used to detect drive control signals or this may be incorporated into the delay of a scheme described below. Settling of switched-capacitor circuit may be accounted for by allocating a predetermined delay that is longer than an expected settling time of the switched-capacitor circuit.

Blocks 616 to 624 are for one cycle of the comparator clock. A determination is made whether the done signal is asserted to logic high (block 626). If the done signal is not asserted, then the process returns to block 616, and the comparator clock is set to logic high to enable comparator 110. Otherwise, if the done signal is asserted, then the process terminates. Although not shown in FIG. 6 for simplicity, when the CLK signal transitions to logic low, the comparator clock may be set to logic low to disable comparator 110, and the process may terminate.

FIG. 6 shows an exemplary design of controlling the operation of comparator 110. In this exemplary design, control logic 130 may "self-oscillate" until the done signal is asserted, so no extra clock may be required. The comparator clock may be generated based on the operation of comparator 110 and may have a variable duration. The operation of comparator 110 may also be controlled in other manners. In another design, the comparator clock may have a fixed frequency, which may be an integer multiple of the CLK frequency. In this design, the comparator clock may be gated based on the COMP_P or COMP_N signal and/or other signals.

Figure 7:
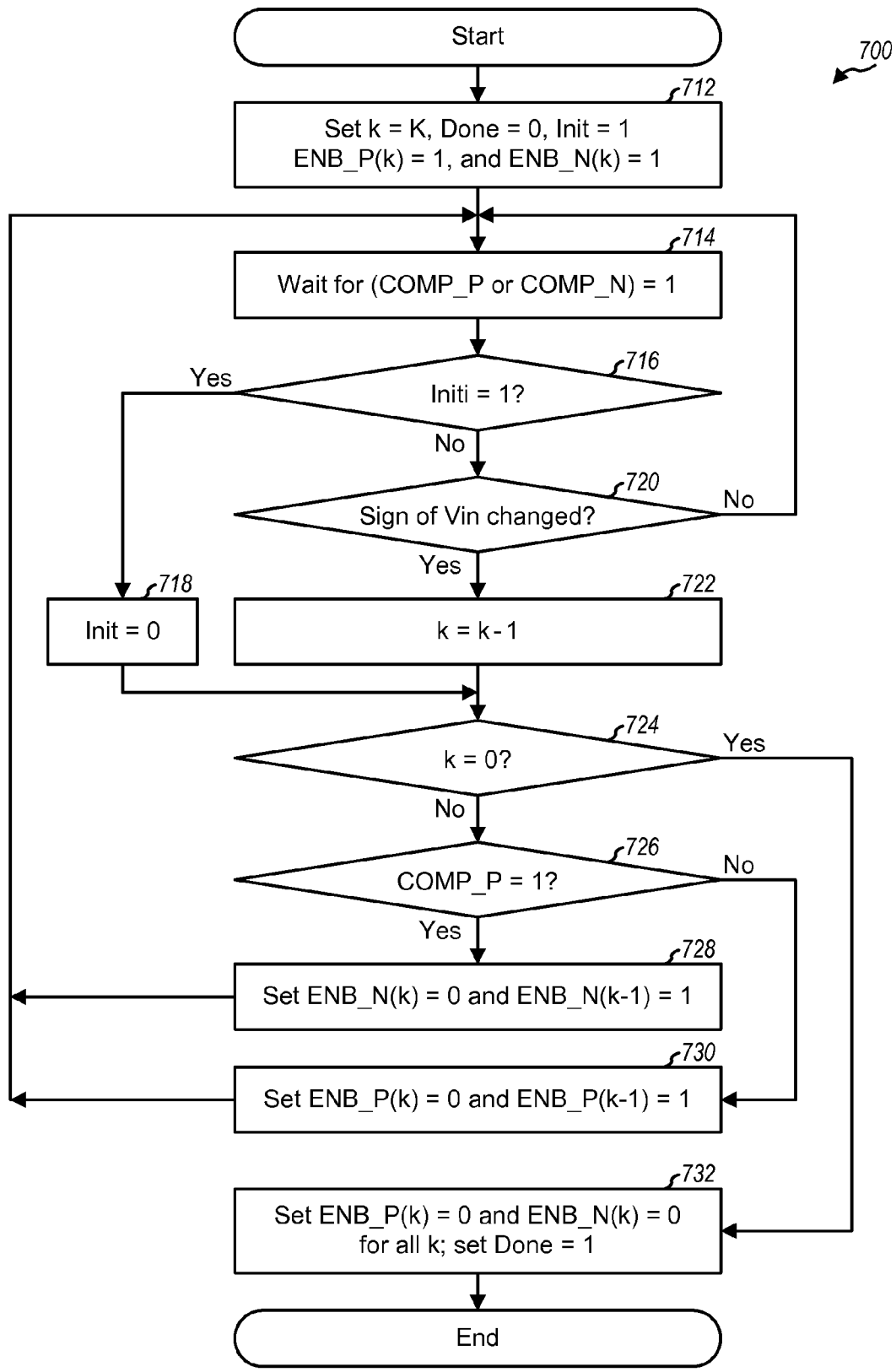
FIG. 7 shows a process illustrating the operation of a drive strength control circuit.

FIG. 7 shows an exemplary design of a process 700 illustrating the operation of drive strength control circuit 520 in FIG. 5 for one cycle of the CLK signal. Output driver 140 in FIG. 1 may have K drive strength levels for K different current pulse amplitudes, where K may be one or greater. K pairs of drive strength signals may be used for the K drive strength levels, one pair of drive strength signals for each drive strength level. Each pair of drive strength signals includes (i) an ENB_P(k) signal that may be set to logic high to indicate that a positive current pulse with the k-th amplitude level should be generated and (ii) an ENB_N(k) signal that may be set to logic high to indicate that a negative current pulse with the k-th amplitude level should be generated, where k∈ {1, ..., K}. At most one of the ENB_P(1) through ENB_P(K) signals may be set to logic high at any given moment. Similarly, at most one of the ENB_N(1) through ENB_N(K) signals may be set to logic high at any given moment.

Initially, index k used to indicate the present drive strength is set to K for the maximum drive strength (block 712). The done signal is initialized to logic low and an init signal is initialized to logic high (also block 712). ENB_P(k) and ENB_N(k) signals are set to logic high (also block 712).

A loop is then performed to adjust the drive strength whenever a change in the sign of the Vin voltage is detected. Drive strength control circuit 520 waits for the COMP_P or COMP_N signal to transition to logic high, which indicates the detection of a positive Vin voltage or a negative Vin voltage by comparator 110 (block 714). A determination is then made whether the init signal is at logic high (block 716). If the answer is 'Yes', which indicates the first iteration through the loop, then the init signal is set to logic low (block 718), and the process proceeds to block 724. Blocks 720 and 722 are bypassed for the first iteration.

Otherwise, if the init signal is not at logic high as determined in block 716, then a determination is then made whether the sign of the Vin voltage has changed (block 720). This may be achieved by determining whether the present COMP_P value is equal to the previous COMP_P value. For each subsequent iteration through the loop except for the first iteration, the previous COMP_P value may be set to the present COMP_P value whenever a change in the sign of the Vin signal is detected.

If there is no change in the sign of the Vin voltage, then the process returns to block 714, and the present drive strength is used for the present current pulse. Conversely, if there is a change in the sign of the Vin voltage, then k is decremented by one to reduce the drive strength (block 722). A determination is then made whether k is equal to zero (block 724). If k is not equal to zero, then a determination is made whether the COMP_P signal has been set to logic high (block 726). If the COMP_P signal has been set to logic high, indicating that the Vin voltage has changed from negative to positive, then the ENB_N(k) signal is set to logic low and the ENB_N(k−1) signal is set to logic high to reduce the drive strength of a negative current pulse (block 728). Otherwise, if the COMP_N signal has been set to logic high, indicating that the Vin voltage has changed from positive to negative, then the ENB_P(k) signal is set to logic low and the ENB_P(k−1) signal is set to logic high to reduce the drive strength of a positive current pulse (block 730). From blocks 728 and 730, the process returns to block 714.

Back in block 724, if k is equal to zero, then the ENB_P(k) and ENB_N(k) signals are set to logic low for all values of k (block 732). The done signal is set to logic high (also block 732). The process then terminates.

FIG. 7 shows an exemplary design of controlling the drive strength of output driver 140. In this exemplary design, only one ENB_P(k) signal and only one ENB_N(k) signal are set to logic high to indicate the present drive strength for positive and negative current pulses, respectively. The drive strength of output driver 140 may also be controlled in other manners. For example, all ENB_P(k) and ENB_N(k) signals may be set to logic high initially, and one pair of ENB_P(k) and ENB_N (k) signal may be reset to logic low when a change in the sign of the Vin voltage is detected.

Figure 8:
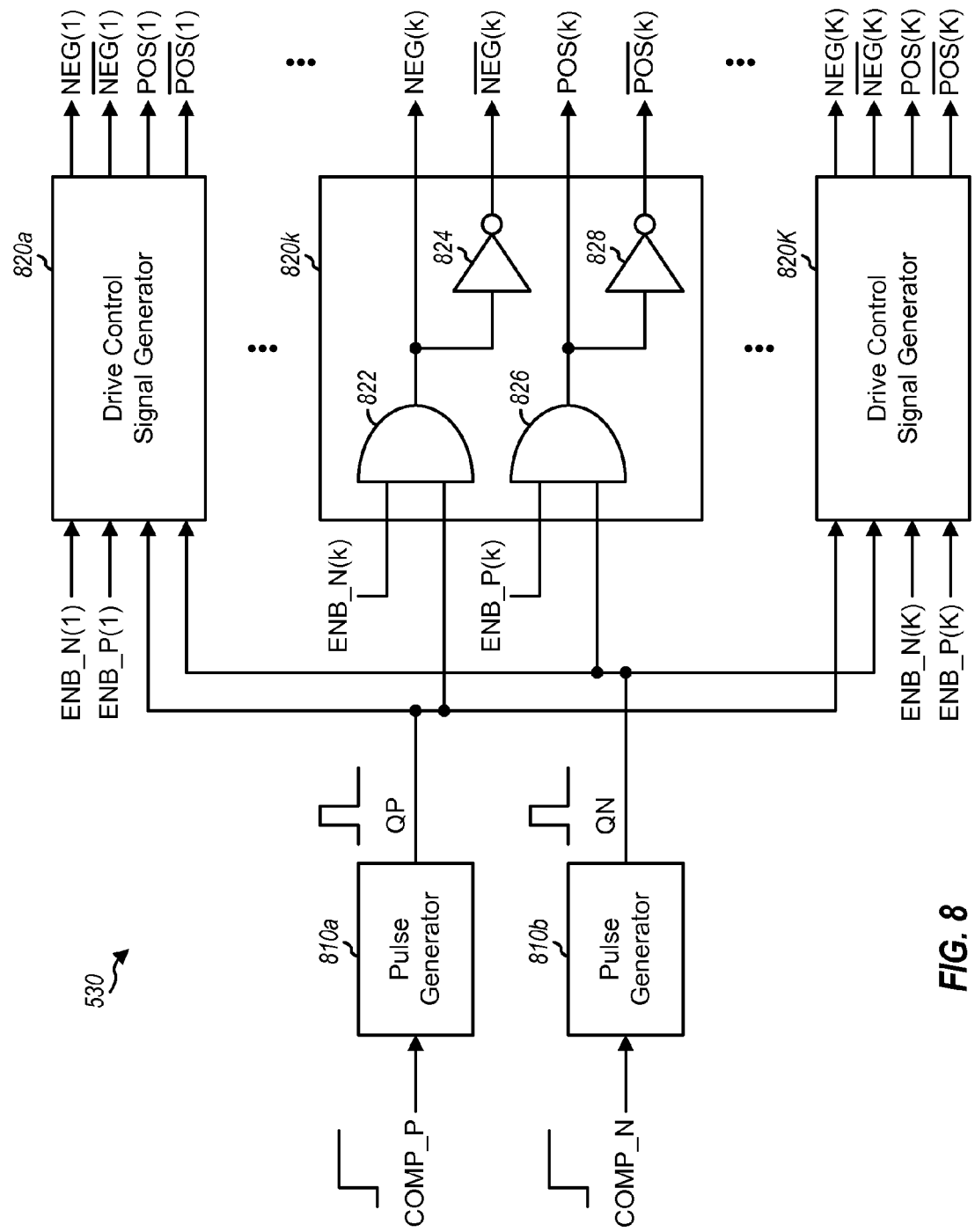
FIG. 8 shows an exemplary design of an output driver control circuit.

FIG. 8 shows a schematic diagram of an exemplary design of output driver control circuit 530 in FIG. 5. In this exemplary design, output driver control circuit 530 includes (i) two pulse generators 810a and 810b for the COMP_P and COMP_N signals, respectively, and (ii) K drive control signal generators 820a through 820K for K output stages within output driver 140.

Pulse generator 810a receives the COMP_P signal and generates a pulse on its output signal, QP, whenever a leading transition is detected on the COMP_P signal. Similarly, pulse generator 810b receives the COMP_N signal and generates a pulse on its output signal, QN, whenever a leading transition is detected on the COMP_N signal.

Each drive control signal generator 820 receives the QP and QN signals from pulse generators 810a and 810b as well as a pair of ENB_P(k) and ENB_N(k) drive strength signals for its output stage. Each signal generator 820 may be (i) disabled if the ENB_P(k) and ENB_N(k) signals are both set to logic low and (ii) enabled if the ENB_P(k) and/or ENB_N (k) signal is set to logic high. If the ENB_N(k) signal is set to logic high, then the pulse on the QP signal is passed through an AND gate 822 and provided as a NEG(k) drive control signal. The NEG(k) signal is also inverted by an inverter 824 and provided as a $\overline{NEG}$(k) drive control signal. If the ENB_P (k) signal is set to logic high, then the pulse on the QN signal is passed through an AND gate 826 and provided as a POS(k) drive control signal. The POS(k) signal is also inverted by an inverter 828 and provided as a $\overline{POS}$(k) drive control signal. The NEG(k), $\overline{NEG}$(k), POS(k) and $\overline{POS}$(k) signals are used to control the k-th output stage, as described below.

Figure 9:
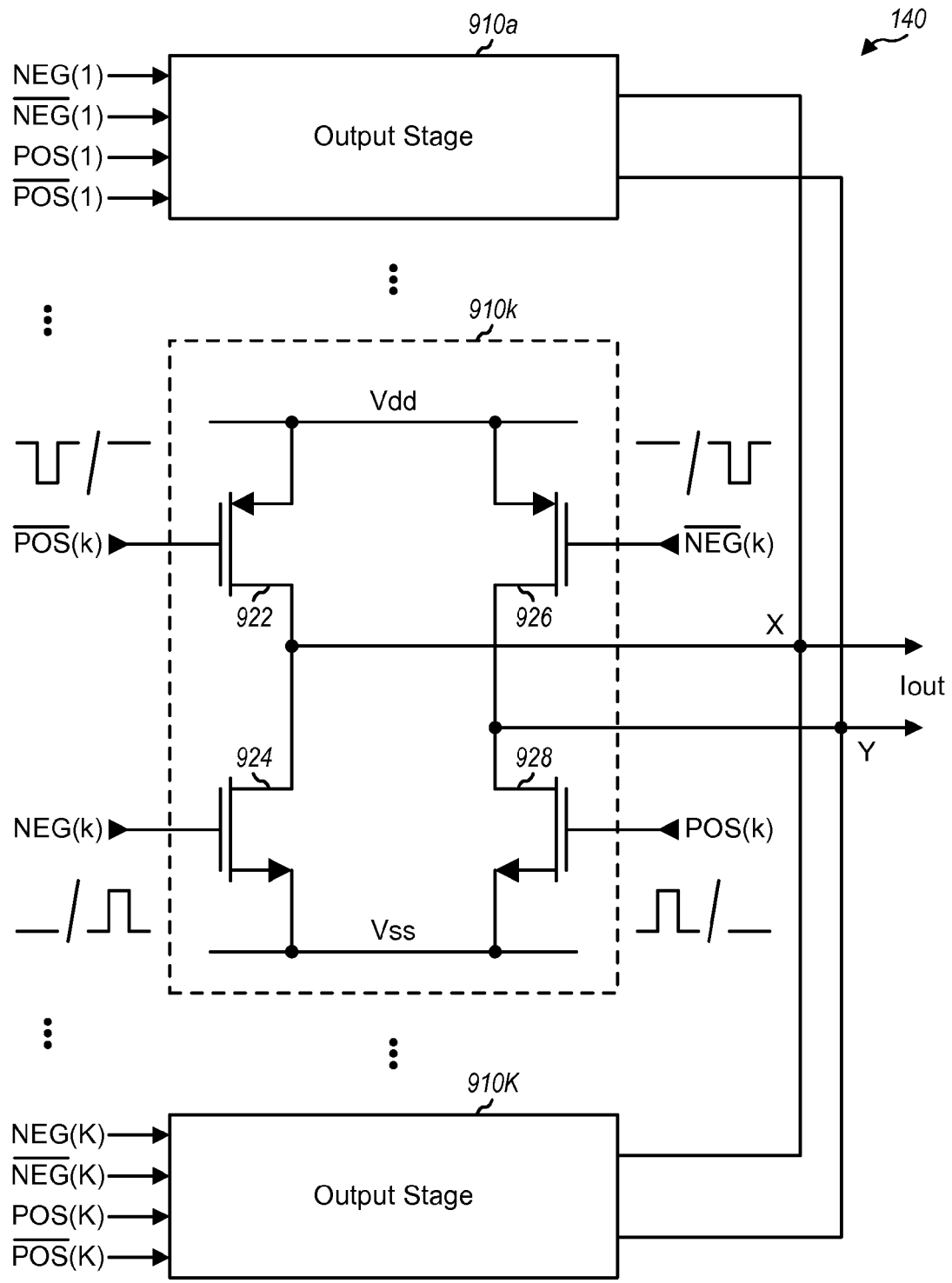
FIG. 9 shows an exemplary design of an output driver.

FIG. 9 shows a schematic diagram of an exemplary design of output driver 140 in FIG. 1. In this exemplary design, output driver 140 includes K output stages 910a through 910K having their outputs coupled together to provide the Iout current. Each output stage 910 includes a pair of PMOS transistors 922 and 926 and a pair of NMOS transistors 924 and 928 coupled as an H-bridge driver. PMOS transistor 922 has its source coupled to Vdd, its gate receiving the $\overline{POS}$(k) signal, and its drain coupled to node X. NMOS transistor 924 has its source coupled to Vss, its gate receiving the NEG(k) signal, and its drain coupled to node X. PMOS transistor 926 has its source coupled to Vdd, its gate receiving the $\overline{\text{NEG}}(k)$ signal, and its drain coupled to node Y. NMOS transistor 928 has its source coupled to Vss, its gate receiving the POS(k) signal, and its drain coupled to node Y. Nodes X and Y provide the Iout current from output driver 140.

As shown in FIG. 9, each output stage 910 receives the NEG(k), $\overline{\text{NEG}}(k)$, POS(k) and $\overline{\text{POS}}(k)$ drive control signals for that output stage. Each output stage 910 generates a positive differential current pulse or a negative differential current pulse if that output stage is enabled. In particular, each output stage 910 generates a positive current pulse if (i) the POS(k) signal has a positive pulse and (ii) the $\overline{\text{POS}}(k)$ signal has a negative pulse, as shown in FIG. 9. In this case, PMOS transistor 922 is turned on and provides a sourcing current to node X, and NMOS transistor 928 is also turned on and provides a sinking current for node Y. Each output stage 910 generates a negative current pulse if (i) the NEG(k) signal has a positive pulse and (ii) the $\overline{\text{NEG}}(k)$ signal has a negative pulse, as also shown in FIG. 9. In this case, NMOS transistor 924 is turned on and provides a sinking current for node X, and PMOS transistor 926 is also turned on and provides a sourcing current to node Y.

In one design, the MOS transistors in the K output stages 910a through 910K have different transistor sizes and can provide different amounts of output current. For example, each output stage may provide x times the amount of output current as a preceding output stage, where x may be an integer or non-integer value greater than one (e.g., x=2). This design may allow for adjustment of the amplitude of the current pulses in geometric steps of varying sizes. In another design, the MOS transistors in the K output stages 910a through 910K have equal size and can provide similar amount of output current. This design may allow for adjustment of the amplitude of the current pulses in linear steps of equal size. For both designs, one or more output stages may be turned on at any given moment to generate the Iout current of a desired magnitude. More output stages and/or output stages with larger drive capability may be turned on to provide current pulses of larger amplitude, and vice versa.

The discrete-time OTA described herein may provide various advantages. First, the discrete-time OTA may provide large gain with more accurate charge transfer in a switched-capacitor circuit and may have a larger output signal swing than a conventional OTA in a low-voltage small-geometry CMOS process. In such a CMOS process, the gain and output signal swing of a conventional OTA may be limited because of small gain of transistors and multiple stacked transistors operating with a small supply voltage. The small gain of the conventional OTA may result in inaccurate charge transfer in a switched-capacitor circuit, and the small output signal swing may result in a small dynamic range. With the discrete-time OTA, accurate charge transfer may be achieved because of the large gain of clocked comparator 110, which can resolve a small input signal. The large gain may be provided by the pre-amplifier and positive feedback of latch 450. Large output signal swing may be achieved because of the simple structure of output driver 140. Output driver 140 includes multiple sets of two stacked transistors (one PMOS transistor and one NMOS transistor) coupled between Vdd and Vss as shown in FIG. 9, and these transistors do not need to be in saturation.

Second, the discrete-time OTA may use less power than the conventional OTA. The settling speed of the conventional OTA may be determined by $C/(\beta \cdot g_m)$, where $g_m$ is the transconductance of the conventional OTA, $\beta$ is a feedback factor, and C is a capacitive load, which may be from a switched-capacitor circuit. For the conventional OTA, faster setting speed may be achieved with larger $g_m$, which may require more power. In contrast, the discrete-time OTA generates current pulses digitally, and the settling time of the discrete-time OTA is not dependent on the $g_m$ of pre-amplifier 410. Hence, pre-amplifier 410 and other circuits in the discrete-time OTA may be designed to consume less power than the conventional OTA.

Third, the discrete-time OTA may be implemented in a smaller area for active components. Pre-amplifier 410 is the only class-A type circuit in the discrete-time OTA, and the remaining circuits are digital in nature and may be implemented in a compact area. Other advantages may also be achieved by the discrete-time OTA.

The discrete-time OTA and the switched-capacitor circuit described herein may be used for various applications such as wireless communication, computing, networking, consumer electronics, etc. The discrete-time OTA and the switched-capacitor circuit may also be used for various electronics devices such as wireless communication devices, broadcast receivers, personal digital assistants (PDAs), handheld devices, wireless modems, laptop computers, cordless phones, wireless local loop (WLL) stations, Bluetooth devices, consumer electronics devices, etc. For clarity, the use of the discrete-time OTA and the switched-capacitor circuit in a wireless communication device is described below.

Figure 10:
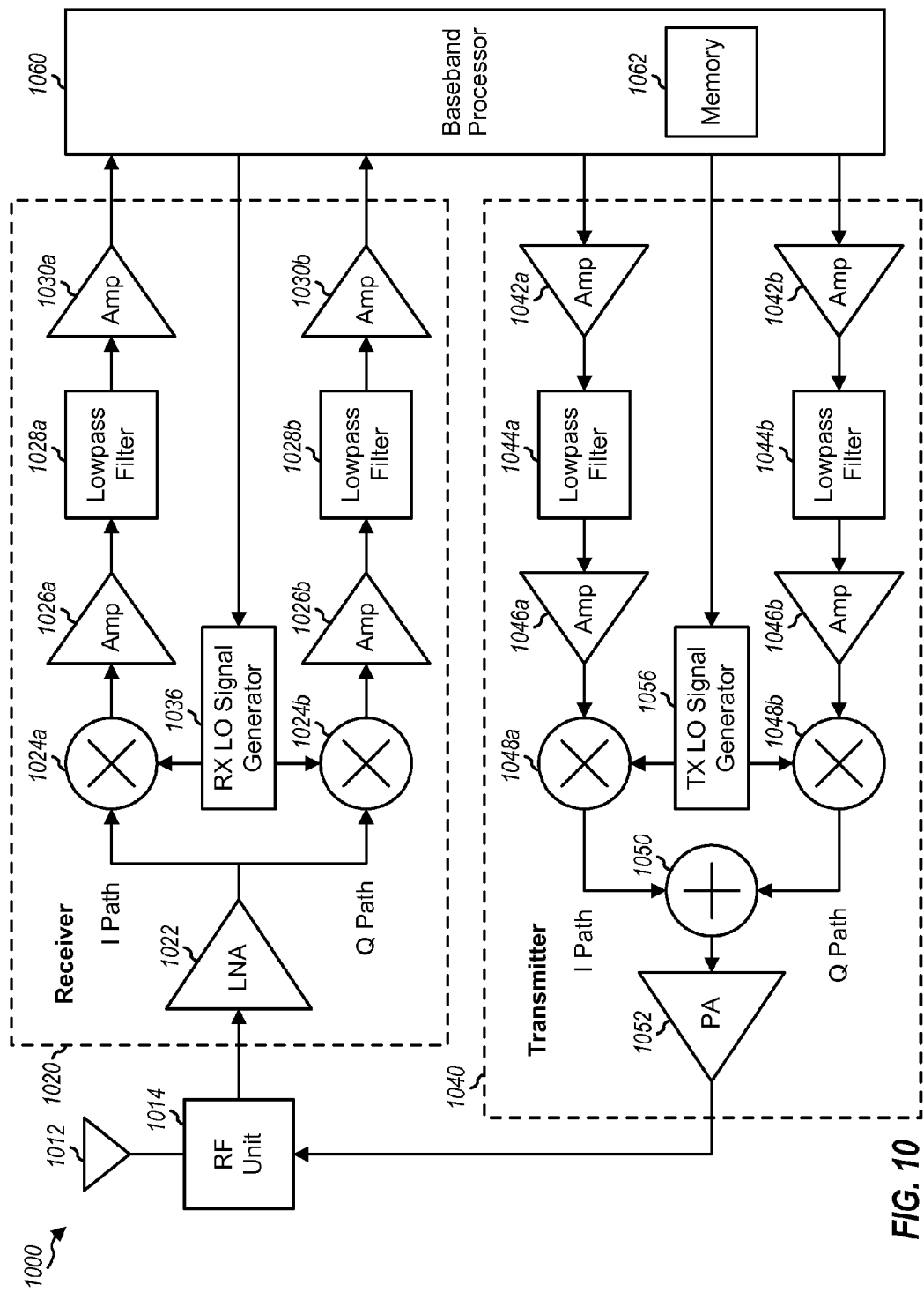
FIG. 10 shows an exemplary design of a wireless communication device.

FIG. 10 shows a block diagram of an exemplary design of a wireless communication device 1000, which may be a cellular phone, a wireless local area network (WLAN) station, or some other device. In the exemplary design shown in FIG. 10, wireless device 1000 includes a receiver 1020 and a transmitter 1040 that support bi-directional communication. In general, wireless device 1000 may include any number of receivers and any number of transmitters for any number of communication systems and any number of frequency bands.

In the receive path, an antenna 1012 receives radio frequency (RF) modulated signals transmitted by base stations and/or other transmitter stations and provides a received RF signal, which is routed through an RF unit 1014 and provided to receiver 1020. RF unit 1014 may include an RF switch and/or a duplexer to multiplex RF signals for transmitter 1040 and receiver 1020. RF unit 1014 may also include RF filters and/or other circuits. Within receiver 1020, a low noise amplifier (LNA) 1022 amplifies the received RF signal and provides an amplified RF signal. Mixers 1024a and 1024b downconvert the amplified RF signal from RF to baseband and provide inphase (I) and quadrature (Q) downconverted signals, respectively. A local oscillator (LO) signal generator 1036 generates I and Q LO signals used for frequency downconversion and provides the I and Q LO signals to mixers 1024a and 1024b, respectively. The I and Q downconverted signals from mixers 1024a and 1024b are amplified by amplifiers (Amp) 1026a and 1026b, filtered by lowpass filters 1028a and 1028b, and further amplified by amplifiers 1030a and 1030b to obtain I and Q baseband input signals, which are provided to a baseband processor 1060. The I and Q baseband input signals may be digitized and processed (e.g., demodulated and decoded) by baseband processor 1060 to recover transmitted data.

In the transmit path, baseband processor 1060 processes data to be transmitted and provides I and Q baseband output signals to transmitter 1040. Within transmitter 1040, the I and Q baseband output signals are amplified by amplifiers 1042a and 1042b, filtered by lowpass filters 1044a and 1044b, and further amplified by amplifiers 1046a and 1046b to obtain I and Q input signals. The I and Q input signals are upconverted from baseband to RF by mixers 1048a and 1048b, summed by a summer 1050, and amplified by a power amplifier (PA)

1052 to obtain an output RF signal, which is routed through RF unit 1014 and transmitted via antenna 1012.

The discrete-time OTA and the switched-capacitor circuit described herein may be used for various circuit blocks in FIG. 10. For example, the discrete-time OTA and/or the switched-capacitor circuit may be used to implement lowpass filters 1028 and/or 1044. The discrete-time OTA and the switched-capacitor circuit may also be used in LO signal generators 1036 and/or 1056 and/or other circuit blocks in FIG. 10.

FIG. 10 shows exemplary designs of receiver 1020 and transmitter 1040 with a direct-conversion architecture, which frequency converts a signal between RF and baseband in one stage. Receiver 1020 and transmitter 1040 may also be implemented with a super-heterodyne architecture that converts a signal between RF and baseband in multiple stages. In general, the conditioning of the signals in receiver 1020 and transmitter 1040 may be performed by one or more stages of amplifier, filter, mixer, etc. The circuit blocks may be arranged differently from the configuration shown in FIG. 10. Furthermore, other circuit blocks not shown in FIG. 10 may also be used to condition the signals in the transmitter and receiver. Some circuit blocks in FIG. 10 may also be omitted. All or a portion of receiver 1020 and transmitter 1040 may be implemented on one or more analog ICs, RF ICs (RFICs), mixed-signal ICs, etc.

Baseband processor 1060 may include various processing units for data transmission and reception as well as other functions. Baseband processor 1060 may also generate controls for various circuit blocks in receiver 1020 and transmitter 1040. A memory 1062 may store program codes and data for wireless device 1000 and may be internal to baseband processor 1060 (as shown in FIG. 10) or external to baseband processor 1060. Baseband processor 1060 may be implemented on one or more application specific integrated circuits (ASICs) and/or other ICs.

In an exemplary design, an apparatus may include a clocked comparator and an output circuit, e.g., as shown in FIG. 1. The clocked comparator may receive an input voltage and provide a digital comparator output. The output circuit may be coupled to the clocked comparator and may receive the digital comparator output and provide current pulses. The clocked comparator and the output circuit may implement an OTA or some other circuit. The apparatus may be a wireless device, an electronic device, an integrated circuit, etc.

In an exemplary design, the output circuit may detect for changes in the sign of the input voltage (or zero crossings in the input voltage) and may reduce the amplitude of the current pulses when a change in the sign of the input voltage is detected, e.g., as shown in FIG. 3B. The output circuit may continue to reduce the amplitude of the current pulses until a minimum amplitude is reached or some other termination condition is encountered. The output circuit may reduce the amplitude of the current pulses in geometric steps (e.g., by one half), in linear steps (e.g., by a fixed amount), or in some other manner when changes in the sign of the input voltage are detected. The output circuit may determine the polarity of the input voltage based on the digital comparator output and may generate the current pulses having an opposite polarity as the input voltage.

In an exemplary design, the clocked comparator may include at least one amplifier stage and a latch, e.g., as shown in FIG. 4. The amplifier stage(s) may be coupled in series and may receive the input voltage and provide an amplified voltage. The latch may be coupled to the last amplifier stage and may receive the amplified voltage and provide the digital comparator output. In another exemplary design, the clocked comparator may comprise a latch and no amplifier stages. For both exemplary designs, the latch may detect for the sign of the input voltage, assert a first comparator output signal (e.g., the COMP_P signal) if the sign of the input voltage is positive, and assert a second comparator output signal (e.g., the COMP_N signal) if the sign of the input voltage is negative. The digital comparator output may comprise the first and second comparator output signals. The latch may be enabled and disabled by a comparator clock. The clocked comparator may detect the input voltage during a designated part (e.g., at a rising edge) of the comparator clock, and the output circuit may provide the current pulses after detection of the input voltage by the clocked comparator.

In an exemplary design, the output circuit may include a control logic and an output driver, e.g., as shown in FIG. 1. The control logic may receive the digital comparator output from the clocked comparator and may provide digital control signals (e.g., the NEG(k), $\overline{\text{NEG}}$(k), POS(k) and $\overline{\text{POS}}$(k) signals). The output driver may be coupled to the control logic and may receive the digital control signals and provide the current pulses. The control logic may generate the comparator clock based on the digital comparator output and possibly other signals, e.g., as shown in FIG. 6. The control logic may also adjust the amplitude of the current pulses based on changes in the sign of the input voltage, e.g., as shown in FIG. 7.

In an exemplary design, the output driver may include a plurality of output stages coupled in parallel, e.g., as shown in FIG. 9. Each output stage may receive a respective set of digital control signals from the control logic and may provide current pulses when enabled by the set of digital control signals. The plurality of output stages may be implemented with transistors of different sizes, which may provide different amounts of current when enabled. Alternatively, the plurality of output stages may be implemented with transistors of equal size, which may provide equal amount of current when enabled.

In another exemplary design, an apparatus may include a switched-capacitor circuit comprising at least one capacitor, a discrete-time OTA, and a plurality of switches, e.g., as shown in FIG. 2A. The capacitor(s) may charge and discharge current. The discrete-time OTA may receive an input voltage and provide current pulses. The switches may couple the capacitor(s) to an input signal and to the discrete-time OTA. The discrete-time OTA may detect for changes in the sign of the input voltage and may reduce the amplitude of the current pulses when a change in the sign of the input voltage is detected. The discrete-time OTA may determine the polarity of the input voltage and may generate current pulses having an opposite polarity as the input voltage. The discrete-time OTA may be implemented with a clocked comparator and an output circuit, e.g., as shown in FIG. 1. The switched-capacitor circuit may implement a lowpass filter, an integrator, or some other circuit.

Figure 11:
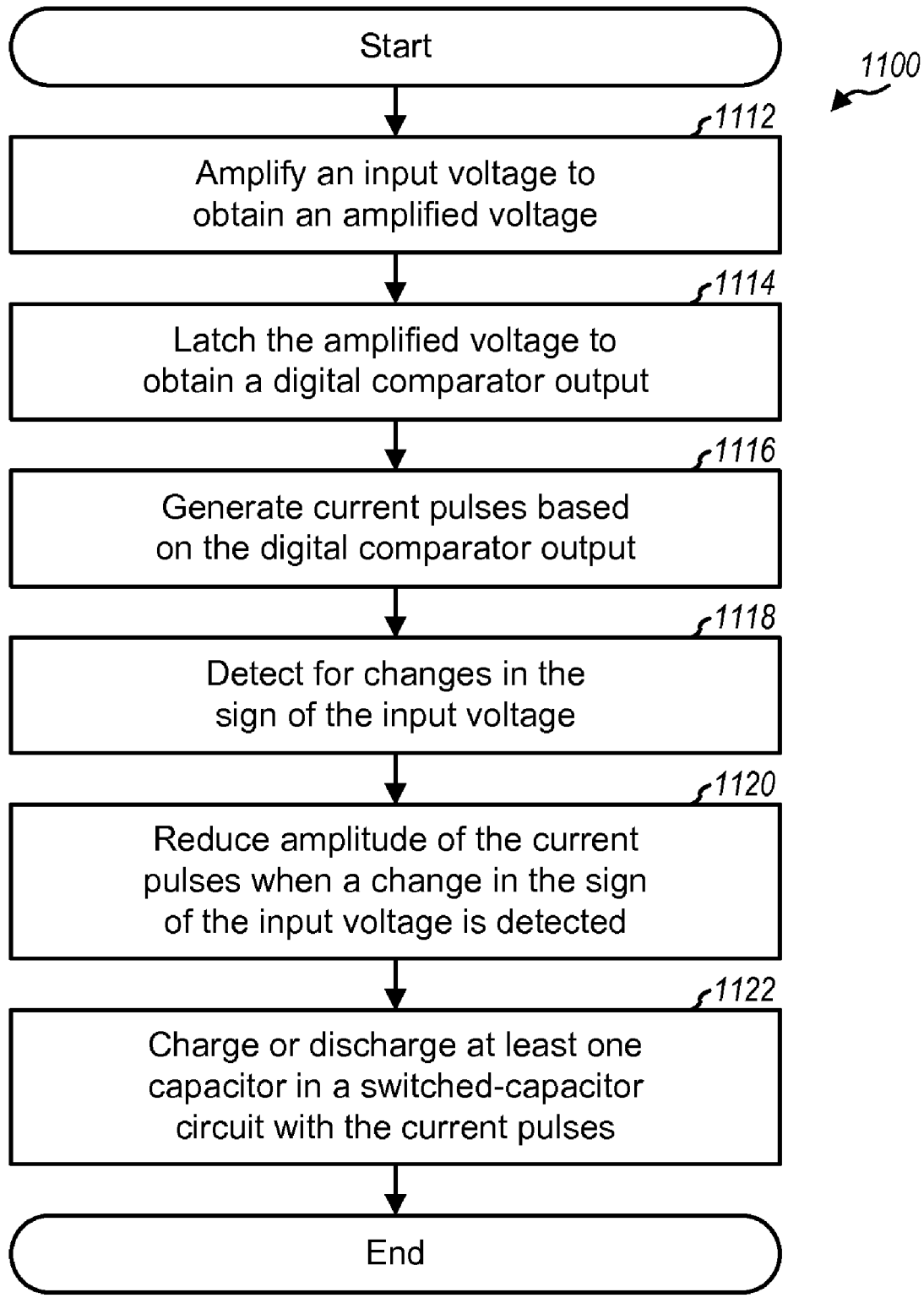
FIG. 11 shows an exemplary design of a process for operating a discrete-time OTA.

FIG. 11 shows an exemplary design of a process 1100 for operating a discrete-time OTA. An input voltage may be amplified to obtain an amplified voltage (block 1112). The amplified voltage may be latched to obtain a digital comparator output (block 1114). Current pulses may be generated based on the digital comparator output (block 1116). In an exemplary design, the input voltage may be determined to have a first polarity based on the digital comparator output. Current pulses having a second polarity opposite of the first polarity may be generated. Changes in the sign of the input voltage may be detected (block 1118). The amplitude of the current pulses may be reduced when a change in the sign of the input voltage is detected (block 1120). A comparator clock may be generated based on the digital comparator output. The input voltage may be amplified and latched during a designated part (e.g., at a rising edge) of the comparator clock, and the current pulses may be generated after detection of the input voltage by the clocked comparator. At least one capacitor in a switched-capacitor circuit may be charged or discharged with the current pulses (block 1122).

The discrete-time OTA and the switched-capacitor circuit described herein may be implemented on an IC, an analog IC, an RFIC, a mixed-signal IC, an ASIC, a printed circuit board (PCB), an electronics device, etc. The discrete-time OTA and switched-capacitor circuit may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the discrete-time OTA and/or the switched-capacitor circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a clocked comparator operative to receive an input voltage and provide a digital comparator output; and
   an output circuit coupled to the clocked comparator and operative to receive the digital comparator output and provide current pulses, wherein the output circuit is operative to reduce the amplitude of the current pulses in geometric steps or linear steps when changes in the sign of the input voltage are detected.

2. An apparatus comprising:
   a clocked comparator operative to receive an input voltage and provide a digital comparator output; and
   an output circuit coupled to the clocked comparator and operative to receive the digital comparator output and provide current pulses, wherein the output circuit is operative to determine the input voltage having a first polarity based on the digital comparator output, and to generate current pulses having a second polarity opposite of the first polarity.

3. The apparatus of claim 1, wherein the clocked comparator is operative to detect the input voltage during a designated part of a comparator clock, and wherein the output circuit is operative to provide the current pulses after detection of the input voltage by the clocked comparator.

4. The apparatus of claim 1, wherein the clocked comparator comprises
   at least one amplifier stage coupled in series and operative to receive the input voltage and provide an amplified voltage, and
   a latch coupled to the at least one amplifier stage and operative to receive the amplified voltage and provide the digital comparator output.

5. The apparatus of claim 4, wherein the latch is operative to detect for sign of the input voltage, to assert a first comparator output signal if the sign of the input voltage is positive, and to assert a second comparator output signal if the sign of the input voltage is negative, and wherein the digital comparator output comprises the first and second comparator output signals.

6. The apparatus of claim 1, wherein the output circuit comprises
   a control logic coupled to the clocked comparator and operative to receive the digital comparator output and provide digital control signals, and
   an output driver coupled to the control logic and operative to receive the digital control signals and provide the current pulses.

7. The apparatus of claim 6, wherein the control logic is operative to generate a comparator clock based on the digital comparator output, and wherein the clocked comparator is enable or disable based on the comparator clock.

8. The apparatus of claim 6, wherein the control logic is operative to adjust amplitude of the current pulses based on changes in sign of the input voltage.

9. The apparatus of claim 6, wherein the output driver comprises
   a plurality of output stages coupled in parallel, each output stage receiving a respective set of digital control signals from the control logic and providing current pulses when enabled by the set of digital control signals.

10. The apparatus of claim 9, wherein the plurality of output stages comprise transistors of different sizes and providing different amounts of current when enabled.

11. The apparatus of claim 9, wherein the plurality of output stages comprise transistors of equal size and providing an equal amount of current when enabled.

12. The apparatus of claim 1, wherein the clocked comparator and the output circuit implement a discrete-time operational transconductance amplifier (OTA).

13. A method comprising:
amplifying an input voltage to obtain an amplified voltage;
latching the amplified voltage to obtain a digital comparator output;
generating current pulses based on the digital comparator output,
detecting changes in sign of the input voltage; and
reducing an amplitude of the current pulses in geometric steps or linear steps when a change in the sign of the input voltage is detected.

14. The method of claim 13, further comprising:
generating a comparator clock based on the digital comparator output, wherein the input voltage is amplified and latched during a designated part of the comparator clock, and wherein the current pulses are generated after detection of the input voltage.

15. A method comprising:
amplifying an input voltage to obtain an amplified voltage;
latching the amplified voltage to obtain a digital comparator output; and
generating current pulses based on the digital comparator output, wherein the generating current pulses comprises
determining the input voltage having a first polarity based on the digital comparator output, and
generating current pulses having a second polarity opposite of the first polarity.

16. The method of claim 13, further comprising:
charging or discharging at least one capacitor in a switched-capacitor circuit with the current pulses.

17. An apparatus comprising:
means for amplifying an input voltage to obtain an amplified voltage;
means for latching the amplified voltage to obtain a digital comparator output;
means for generating current pulses based on the digital comparator output,
means for detecting changes in sign of the input voltage; and
means for reducing an amplitude of the current pulses in geometric steps or linear steps when a change in the sign of the input voltage is detected.

18. The apparatus of claim 17, further comprising:
means for generating a comparator clock based on the digital comparator output, wherein the input voltage is amplified and latched during a designated part of the comparator clock, and wherein the current pulses are generated after detection of the input voltage.

19. An apparatus comprising:
means for amplifying an input voltage to obtain an amplified voltage;
means for latching the amplified voltage to obtain a digital comparator output; and
means for generating current pulses based on the digital comparator output, wherein the means for generating current pulses comprises
means for determining the input voltage having a first polarity based on the digital comparator output, and
means for generating current pulses having a second polarity opposite of the first polarity.

20. The apparatus of claim 17, further comprising:
means for charging or discharging at least one capacitor in a switched-capacitor circuit with the current pulses.

* * * * *